(12) United States Patent
Choi et al.

(10) Patent No.: US 6,849,378 B2
(45) Date of Patent: Feb. 1, 2005

(54) PHOTOSENSITIVE POLYMERS, RESIST COMPOSITIONS COMPRISING THE SAME, AND METHODS FOR FORMING PHOTORESISTIVE PATTERNS

(75) Inventors: Sangjun Choi, Seoul (KR); Hyunwo Kim, Suwon (KR); Joontae Moon, Yongin (KR); Sanggyun Woo, Yongin (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 209 days.

(21) Appl. No.: 10/123,431

(22) Filed: Apr. 17, 2002

(65) Prior Publication Data

US 2003/0203306 A1 Oct. 30, 2003

(51) Int. Cl.[7] .............................. G03F 7/004; G03F 7/00
(52) U.S. Cl. .................... 430/270.1; 430/326; 430/910; 526/281; 526/320; 526/321
(58) Field of Search .............................. 430/270.1, 910, 430/326; 526/320, 321, 281

(56) References Cited

U.S. PATENT DOCUMENTS

2001/0024763 A1 * 9/2001 Choi et al. ................ 430/270.1
2003/0091928 A1 * 5/2003 Choi ....................... 430/270.1

OTHER PUBLICATIONS

"Implementation of the ArF resists based on VEMA for sub–100 nm device" (from the Proceedings of SPIE–The International Society for Optical Engineering, 4690 (Pt. 1, Advances in Resist Technology and Processing XIX), 533–540 (English) 2002. ISSN:0277–786X).*

* cited by examiner

*Primary Examiner*—Amanda Walke
(74) *Attorney, Agent, or Firm*—Volentine Francos & Whitt, P.L.L.C.

(57) ABSTRACT

A resist composition includes a photoacid generator (PAG) and a photosensitive polymer. The photosensitive polymer includes a comonomer having an acid-labile substituent group or a polar functional group, and a copolymer of alkyl vinyl ether and maleic anhydride. The copolymer is represented by the following structure:

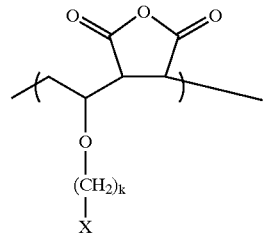

where k is an integer of 3 to 8, and where X is tertiary cyclic alcohol having 7 to 20 carbon atoms.

39 Claims, No Drawings

PHOTOSENSITIVE POLYMERS, RESIST COMPOSITIONS COMPRISING THE SAME, AND METHODS FOR FORMING PHOTORESISTIVE PATTERNS

BACKGROUND OF THE INVENTION

1. Field of the Invention

The present invention generally relates to photosensitive polymers, and more particularly, the present invention relates to photosensitive polymers used in the manufacture of photoresist compositions, to photoresist compositions containing such photosensitive polymers, and to methods of forming photoresist patterns to be used in photolithography processes.

2. Description of the Related Art

As the integration density and complexity of semiconductor devices continue to increase, the ability to form ultra-fine patterns becomes more and more critical. For example, in 1-Gigabit or higher semiconductor devices, a pattern size having a design rule of 0.2 μm or less is needed. For this reason, in lithography processes, lower wavelength devices such as the ArF eximer laser (193 nm) have emerged as exposure light sources which are preferred over the more conventional and higher wavelength KrF eximer laser (248 nm).

However, compared with conventional (KrF) resist materials, resist materials which are suitable for use with the ArF eximer laser suffer from a variety drawbacks. The most serious problems relate transmittance and resistance to dry etching.

Almost all well-known ArF resist compositions contain (meth)acryl-based polymers. Among these polymers, a methacrylate copolymer having an alicyclic protecting group, which is expressed by the formula below, has been suggested (*J. Photopolym. Sci. Technol.*, 9(3), pp. 509 (1996)):

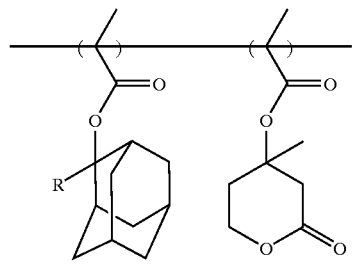

This polymer has an adamantyl group, which contributes to enhancing resistance to dry etching, and a lactone group, which improves adhesiveness, in its methacrylate backbone. As a result, the resolution of the resist and the depth of focus are improved. However, resistance to dry etching is still weak, and serious line edge roughness is observed after line patterns are formed from the resist layer.

Another drawback of the aforementioned polymer is that the raw material used to synthesize the polymer is expensive. In particular, the manufacturing cost of a polymer having a lactone group, which is introduced to improve adhesiveness, is so high that its practical use as a resist is difficult.

As another conventional resist composition, a cycloolefin-maleic anhydride (COMA) alternating polymer having the following formula has been suggested (*J. Photopolym. Sci. Technol.*, Vol. 12(4), pp. 553 (1999), and U.S. Pat. No. 5,843,624):

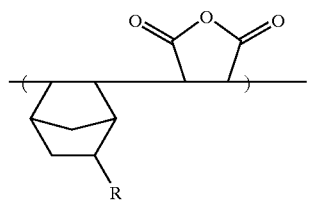

In the production of a copolymer, such as a COMA alternating polymer having the formula above, the production cost of raw material is relatively inexpensive, but the yield of the polymer sharply decreases. In addition, the transmittance of the polymer is very low at a short wavelength region, for example at 193 nm. The synthetic polymers have in their backbone the alicyclic group, which exhibits prominent hydrophobicity, and thus the adhesiveness to neighboring material layers is very poor.

The copolymer has a glass transition temperature of 200° C. or more due to the structural characteristic of the backbone. As a result, it is difficult to carry out an annealing process for eliminating free volume from the resist layer formed of the polymer, and accordingly the resist layer is influenced by ambient conditions which can cause, for example, a T-top profile of corresponding resist patterns. In addition, the resist layer itself becomes less resistant to ambient conditions during post-exposure delay, so that many problems can occur during subsequent processes with respect to the photoresist layer.

To improve the resolution of the resist layer, the polymer system may be charged with a polar group. In recent years, a technique of introducing a lactone group into a methacrylate monomer having an alicyclic protecting group, using the following alicyclic compounds with a lactone group, has been suggested so as to enhance the resistance to dry etching (*J. Photopolym. Sci. Technol.*, Vol. 13(4), pp. 601 (2000), and Japanese Patent Laid-open No. hei 12-26446):

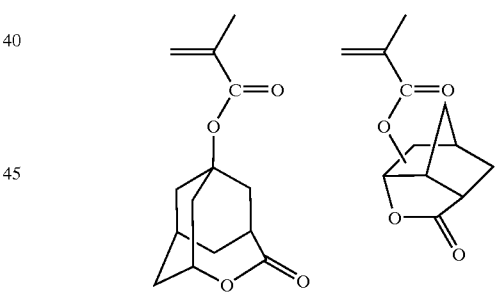

Unfortunately, the yield of the monomer having the above formula is so low as to substantially increase manufacturing costs.

As described above, drawbacks of conventional ArF resist structures often relate to dry-etch resistance, LER and e-beam shrinkage. In particular, line-edge roughness (LER) and e-beam shrinkage are considered the most serious problems.

Environmentally stable chemically amplified photoresists require post bakes at temperatures close to the Tg of the bulk polymer in order to minimize the free volume (dynamic volume). As a result, Tg is an important property of polymer materials. At the vicinity of the Tg, the molecules of the photoresist materials become relatively stable from an initial disordered state, resulting in a reduction of free volume contained in the photoresist polymers. In the end, the photoresist film becomes hard and dense (annealing effect).

Film densification in this manner prevents contaminants from absorbing into the photoresist layer where they would otherwise interfere with a photosensitive acid generator and cause defective patterns, thus increasing image stability with respect to a delay between exposure and post-exposure bake (PEB). As a result, T-top profiles caused by contaminants or CD variation due to the diffusion of acid by post-exposure delay (PED) is reduced (ESCAP concept).

Annealing of the photoresist film advantageously reduces shrinkage from e-beam exposure because the photoresist film becomes relatively hard and dense. The robustness of annealed resists, which is presumably due to the reduced free volume, allows manipulation of the bake conditions for optimal performance.

Unfortunately, while annealing of most KrF resist materials is a relatively simple matter, annealing of known ArF resist materials is problematic in view of their substantially higher Tg. That is, the ArF photoresist can decompose at temperatures which are high enough to vaporize unwanted organic solvents and to harden the photoresist film. In other words, the temperatures needed to achieve the advantageous effects of annealing are too high to avoid decomposition of the ArF photoresist film.

Accordingly, there is a desire for ArF photoresist compositions which exhibit relatively low glass transition temperatures.

SUMMARY OF THE INVENTION

According to one aspect of the present invention, a photosensitive polymer includes a copolymer of alkyl vinyl ether and maleic anhydride, where the copolymer is represented by the following structure:

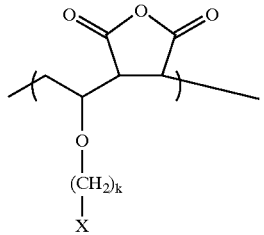

and where k is an integer of 3 to 8, and wherein X is tertiary cyclic alcohol having 7 to 20 carbon atoms.

According to another aspect of the present invention, a photosensitive polymer includes (a) a copolymer of alkyl vinyl ether and maleic anhydride, and (b) a comonomer having an acid-labile substituent or a polar functional group, where the copolymer is represented by the following structure:

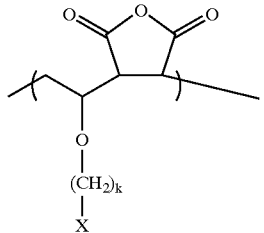

where k is an integer of 3 to 8, and where X is tertiary cyclic alcohol having 7 to 20 carbon atoms.

According to still another aspect of the present invention, a photosensitive polymer includes (a) a copolymer of alkyl vinyl ether and maleic anhydride, and (b) and at least two comonomers each comprising (meth)acrylic acid and (meth)acrylate or norbornene derivatives having an acid-labile substituent or a polar functional group, where the copolymer is represented by the following structure:

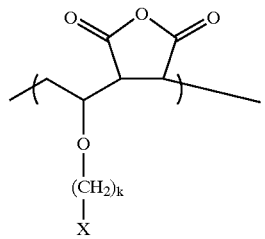

where k is an integer of 3 to 8, and where X is tertiary cyclic alcohol having 7 to 20 carbon atoms.

According to yet another aspect of the present invention, a resist composition includes (a) a photoacid generator (PAG), and (b) a photosensitive polymer comprising (1) a comonomer having an acid-labile substituent group or a polar functional group, and (2) a copolymer of alkyl vinyl ether and maleic anhydride, where the copolymer is represented by the following structure:

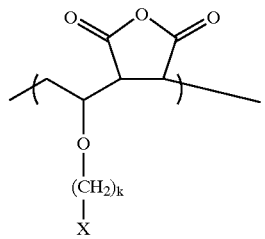

where k is an integer of 3 to 8, and where X is tertiary cyclic alcohol having 7 to 20 carbon atoms.

According to another aspect of the invention, a method of forming a photoresist pattern includes applying a resist composition on a substrate, the resist composition having (a) a photoacid generator(PAG) and (b) a photosensitive polymer comprising (1) a comonomer having an acid-labile substituent group or a polar functional group, and (2) a copolymer of alkyl vinyl ether and maleic anhydride, the copolymer represented by the following structure:

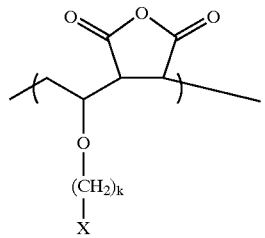

where k is an integer of 3 to 8, and where X is tertiary cyclic alcohol having 7 to 20 carbon atoms. The resist composition is then exposed to patterned radiation to introduce a patterned image therein, where the radiation is ultraviolet radiation, x-ray radiation, and/or electron beam radiation. The substrate is then baked and developed.

DETAILED DESCRIPTION OF THE PREFERRED EMBODIMENTS

The photosensitive polymers of the present invention may be used to realize photoresist compositions exhibiting relatively low glass transition temperature (Tg) values. For example, Tg values in the range of 130–160° C. may be achieved, thereby facilitating the use of anneal processes. As discussed previously, annealing of the photoresist film increases a hardness of the film, which in turn reduces shrinkage caused by e-beam exposure.

One photosensitive polymer of the invention includes a copolymer of alkyl vinyl ether and maleic anhydride, where the copolymer is represented by the following structure:

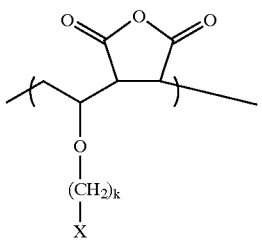

where k is an integer of 3 to 8, and X is tertiary cyclic alcohol having 7 to 20 carbon atoms. The cyclic alcohol may be a cyclopentyl group, a cyclohexyl group, an a-norbornyl group, a 2-adamantyl group, a 8-tricyclodecyl group, or a decahydronaphthyl group. The weight average molecular weight of the copolymer may be in the range of 3,000 to 50,000.

Another photosensitive polymer of the present invention includes a copolymer of alkyl vinyl ether and maleic anhydride, and a comonomer having an acid-labile substituent or a polar functional group, where the copolymer represented by the following structure:

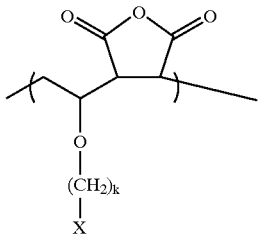

where k is an integer of 3 to 8, and wherein X is tertiary cyclic alcohol having 7 to 20 carbon atoms. Again, the weight average molecular weight of the photosensitive polymer is in the range of 3,000 to 50,000.

The comonomer may be a (meth)acrylate derivative and the photosensitive polymer may be represented by the following structure:

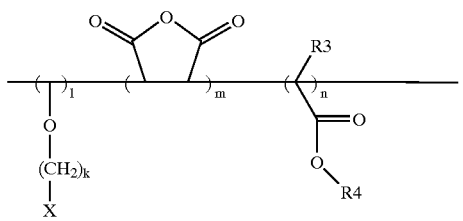

where R3 is a hydrogen atom or a methyl group, R4 is an acid-labile group having 4 to 20 carbon atoms, and $l/(l+m+n)=0.1$ to 0.4, $m/(l+m+n)=0.3$ to 0.5, $n/(l+m+n)=0.2$ to 0.5. R4 may be one of a tert-butyl group, a tetrahydropyranyl group, and a 1-ethoxy ethyl group; R4 may be an alicyclic acid-labile group; and RF may be one of 2-methyl-2-adamantyl, 2-ethyl-2-adamantyl, 2-propyl-2-adamantyl, 8-methyl-8-tricyclodecyl, 8-ethyl-8-tricyclodecyl. Again, the weight average molecular weight of the photosensitive polymer may be in the range of 3,000 to 50,000.

The comonomer may instead be a norbornene derivative and the photosensitive polymer may instead be represented by the following structure:

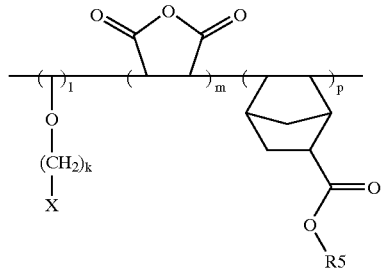

wherein R5 is an acid-labile group having 4 to 20 carbon atoms, and $l/(l+m+p)=0.1$ to 0.4, $m/(l+m+p)=0.3$ to 0.5, and $p/(l+m+p)=0.2$ to 0.5. R5 may be one of a tert-butyl group, a tetrahydropyranyl group, and a 1-ethoxy ethyl group; R5 may be an alicyclic acid-labile group; and R5 may be one of 2-methyl-2-adamantyl, 2-ethyl-2-adamantyl, 2-propyl-2-adamantyl, 8-methyl-8-tricyclodecyl, 8-ethyl-8-tricyclodecyl. Again, the weight average molecular weight of the photosensitive polymer may be in the range of 3,000 to 50,000.

Another photosensitive polymer of the present invention includes a copolymer of alkyl vinyl ether and maleic anhydride, where the copolymer represented by the following structure:

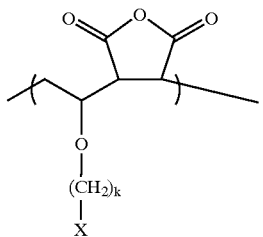

where k is an integer of 3 to 8, and where X is tertiary cyclic alcohol having 7 to 20 carbon atoms, the photosensitive polymer further includes at least two comonomers each comprising (meth)acrylic acid and (meth)acrylate or norbornene derivatives having an acid-labile substituent or a polar functional group. The cyclic alcohol may be one of a cyclopentyl group, a cyclohexyl group, an a-norbornyl group, a 2-adamantyl group, an 8-tricyclodecyl group, and a decahydronaphthyl group. The weight average molecular weight of the photosensitive polymer may be in the range of 3,000 to 50,000.

The photosensitive polymer may be represented by the following structure:

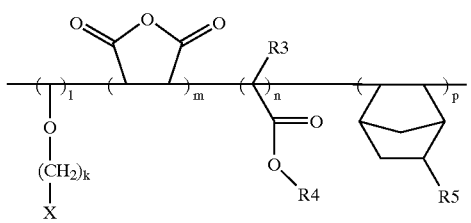

wherein R3 is a hydrogen atom or a methyl group, R4 and R5 is one of a hydrogen, hydroxy, alkyl, alkoxy, ester, nitrile group and an acid labile group having 4 to 20 carbon atoms, at least one of R4 and R5 is an acid labile group having 4 to 20 carbon atoms, and $l/(l+m+n+p)=0.1$ to 0.4, $m/(l+m+n+p)=0.3$ to 0.5, $n/(l+m+n+p)=0.2$ to 0.5, and $p/(l+m+n+p)=0.2$ to 0.5. Here, R4 may be one of a tert-butyl group, a tetrahydropyranyl group, and a 1-ethoxy ethyl group; R4 may be an alicyclic acid-labile group; and R4 may be one of 2-methyl-2-adamantyl, 2-ethyl-2-adamantyl, 2-propyl-2-adamantyl, 8-methyl-8-tricyclodecyl, 8-ethyl-8-tricyclodecyl. Also, R5 may be one of a tert-butyl ester group, a tetrahydropyranyl ester group, and a 1-ethoxy ethyl ester group; R5 may be an alicyclic acid-labile ester group; and R5 may be one of 2-methyl-2-adamantyl, 2-ethyl-2-adamantyl, 2-propyl-2-adamantyl, 8-methyl-8-tricyclodecyl, 8-ethyl-8-tricyclodecyl.

A resist composition of the invention includes a photoacid generator(PAG), and any of the photosensitive polymers described above. For example, the resist composition may include a PAG and photosensitive polymer having a comonomer having an acid-labile substituent group or a polar functional group, and a copolymer of alkyl vinyl ether and maleic anhydride, where the copolymer is represented by the following structure:

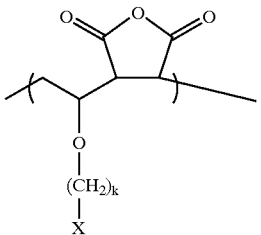

where k is an integer of 3 to 8, and where X is tertiary cyclic alcohol having 7 to 20 carbon atoms. The cyclic alcohol may be one of a cyclopentyl group, a cyclohexyl group, an a-norbornyl group, a 2-adamantyl group, an 8-tricyclodecyl group, and a decahydronaphthyl group. The comonomer may include a (meth)acrylate or norbornene derivative, and the comonomer may have an alicyclic hydrocarbon group as a substituent.

The PAG may be contained in amount of 1 to 10% by weight based on the weight of the photosensitive polymer, and the PAG may be selected from the group consisting of triarylsulfonium salts, diaryliodonium salts, sulfonates or mixtures thereof.

The resist composition may further include an organic base, and the organic base may be contained in amount of 0.1 to 1.0% by weight based on the concentration of the PAG. The organic base may be a compound including tertiary amine alone or a mixture of at least two kinds thereof. Specific examples of organic bases include triethylamine, trusobutylamine, trioctylamine, triisodecylamine, triethanolamine and mixtures thereof.

In a method of forming a photoresist pattern, the resist composition of the invention is first applied on a substrate. Then, the resist composition is exposed to patterned radiation to introduce a patterned image into the resist composition. The radiation may be ultraviolet radiation, x-ray radiation, and/or electron beam radiation. The substrate having the patterned resist composition is then baked (annealed), and the baked substrate is then developed. Preferably, the anneal takes place at a temperature range of 130° C. to 160° C.

SYNTHESIS EXAMPLE 1

Synthesis of 2-Hydroxy-2-adamantylethyl Vinyl Ether (I)

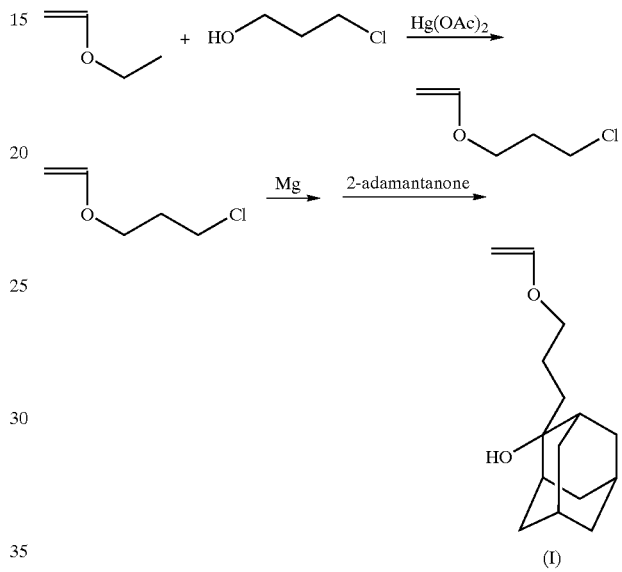

(Step-1) Mercury acetate (5 mol %) was added to a round bottom flask containing 3-chloropropanol (48 g, 0.5 mol) and ethyl vinyl ether (180 g, 2.5 mol). Next, the resulting mixture was refluxed for 8 hours. After the reaction was completed, 3-chloropropyl vinyl ether was obtained through vacuum distillation of the reaction solution.

(Step-2) Magnesium metal(2.6 g) and anhydrous tetrahydrofuran (hereinafter referred to as THF(100 mL)) were added to a round bottom flask. Next, after dripping a small quantity of dibromoethane into the round bottom flask containing the resulting mixture to promote the reaction, 3-chloropropyl vinyl ether (12 g, 0.1 mol) and anhydrous THF(100 mL) were added drop-wise thereto. Then, the mixture was reacted for 2 hours. After dripping an adequate quantity of THF containing 2-adamantanone (15 g, 0.1 mol) in the mixture, the resulting mixture was refluxed for 12 hours. After the reaction was completed, the reaction mixture was slowly dissolved in excessive water and neutralized with thin $H_2SO_4$ solution. Then, the organic layer was extracted from the reaction solution using an adequate quantity of diethyl ether and then dried with anhydrous sodium sulfate. Next, after evaporating the solvent to obtain an oily residue using a rotary evaporator, the product was separated using a column chromatography method (hexane:ethyl acetate=3:1). (Yield: 60%)

SYNTHESIS EXAMPLE 2

Synthesis of 8-Hydroxy-8-tricyclodecylethyl Vinyl Ether (II)

The monomer having the form of a tertiary alcohol can be easily synthesized by using 8-tricyclodecanone (0.1 mol)

through Grignard reaction by the same method as that of Synthesis Example 1. (Yield: 60%)

Meanwhile, various monomers having the form of a tertiary alcohol can be synthesized using the same method as in Synthesis Example 1 by reacting cyclic ketone or alicyclic ketone compounds with various Grignard reagents of haloalkyl vinyl ether. The cyclic ketone or alicyclic ketone includes cyclopentanone, cyclohexanone, 2-norbornanone, 2-adamantanone, 8-tricyclodecanone, etc. It is preferable to use haloalkyl vinyl ether having a methylene linkage having 3 to 6 carbon atoms.

SYNTHESIS EXAMPLE 3

Synthesis of Copolymer

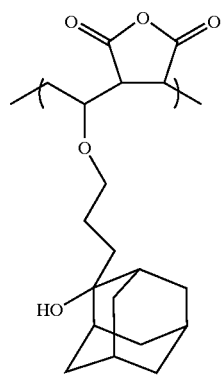

The monomer (11 g, 50 mmol) prepared by Synthesis Example 1 and maleic anhydride (5.0 g, 50 mmol) were dissolved in THF (40 g), and azobisisobutyronitrile (hereinafter referred to AIBN (2 mol %)) was added thereto. After purging it with nitrogen gas, the mixture solution was polymerized at a temperature of 70° C. for about 12 hours. After polymerization, the reaction product was precipitated slowly in excessive n-hexane and the precipitates were filtered. Next, after dissolving the resulting filtrate in THF and re-precipitating it in n-hexane, the precipitated solution was dried in a vacuum oven maintained at 50° C. for about 24 hours to obtain a copolymer product. (Yield: 85%) (Mw=9,700) (Mw/Mn=2.0)

SYNTHESIS EXAMPLE 4

Synthesis of Copolymer

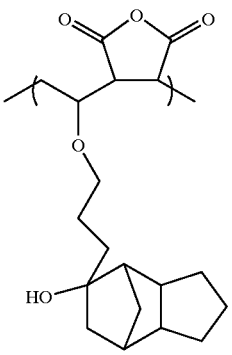

After synthesizing the monomer (11 g, 50 mmol) prepared by Synthesis Example 1 and maleic anhydride (5.0 g, 50 mmol) prepared using the method of Synthesis Example 3, the polymer was obtained by precipitating in n-hexane. (Yield: 80%) (Mw=10,500) (Mw/Mn=2.1)

SYNTHESIS EXAMPLE 5

Synthesis of Terpolymer

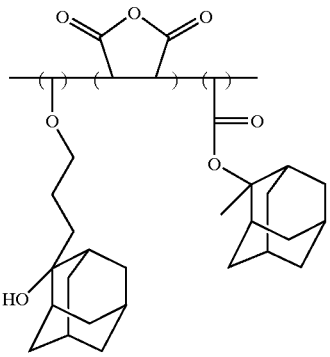

The monomer (11 g, 50 mmol) prepared by Synthesis Example 1, maleic anhydride(2.0 g, 20 mmol) and 2-methyl-2-adamantyl acrylate(4.4 g, 20 mmol) were dissolved in THF(10 g). Then, AIBN(0.2 g) was added thereto. Residual $O_2$ (oxygen gas) was removed from the solution by using liquid $N_2$. Next, after purging it with nitrogen gas and sealing, polymerization was continued for 20 hours at 70° C. (Yield: 70%) (Mw=8,900) (Mw/Mn=1.9)

After polymerization, the reaction product was precipitated slowly in excessive n-hexane and the precipitates were filtered. Next, after dissolving the resulting filtrate in THF and re-precipitating it in n-hexane, the precipitated solution was dried in a vacuum oven maintained at 50° C. for about 24 hours to obtain the terpolymer product.

SYNTHESIS EXAMPLE 6

Synthesis of Terpolymer

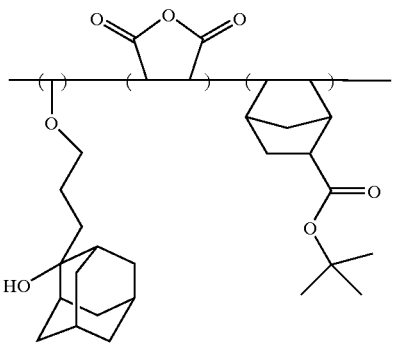

The monomer (4.4 g, 20 mmol) prepared by Synthesis Example 1, maleic anhydride (4.0 g, 40 mmol) and tert-butyl 5-norbornene-2-carboxylate (3.9 g, 20 mmol) were dissolved in THF(20 g). Then, AIBN (0.2 g, 2 mol %) was added thereto. The terpolymer can be obtained using the same method as in Synthesis Example 5. (Yield: 65%) (Mw=7,700) (Mw/Mn=2.0)

SYNTHESIS EXAMPLE 7

Synthesis of Tetrapolymer

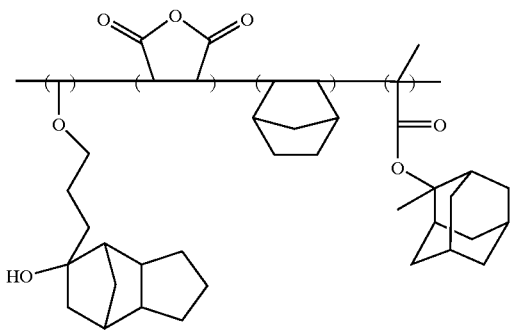

The monomer (4.4 g, 20 mmol) prepared by Synthesis Example 2, maleic anhydride (3.0 g, 30 mmol) and 2-methyl-2-adamantyl methacrylate(7.0 g, 30 mmol) were dissolved in THF(20 g). Then, AIBN(2 mol %) was added thereto. The tetrapolymer can be obtained using the same method as in Synthesis Example 5.

As described in the synthesis examples above, terpolymers and tetrapolymers in accordance with the invention can be easily produced by introducing acrylate derivatives or norbornene derivatives into a vinyl ether-maleic anhydride copolymer. It is sufficient that ratio of the monomer having acid-labile protecting group to be about 10~40 mol % of the total monomer. The polymer obtained by above-described polymerization exhibits a weight average molecular weight of 3,000 to 100,000.

SYNTHESIS EXAMPLE 8

Synthesis of Resist Composition (I)

The terpolymer (1 g) obtained in Synthesis Example 5 and triphenylsulfonium triflate (TPSOTf) (0.01 g) as a PAG, and triisooctylamine (2 mg) as a organic base were completely dissolved in propylene glycol monomethyl ether acetate (PGMEA)(7 g), and then filtered through a membrane filter of 0.2 µm, resulting in a photoresist composition.

The resist composition was applied onto a bare Si-wafer coated with hexamethyldisilazane (HMDS) to form a 0.3 µm-thick photoresist film, followed by pre-baking at a temperature of 130° C. for 60 seconds, and exposure using an ArF excimer laser exposure apparatus (0.6 NA, σ 0.75).

Subsequently, warming (PEB) of the photoresist film after exposure was conducted at a temperature of 130° C. for 60 seconds, followed by development using 2.38 wt % aqueous solution of tetramethyl ammonium hydroxide (TMAH) for 60 seconds to form a photoresist pattern. Consequently, an L/S pattern of 180 nm was verified to be formed clearly at the dose of 13 mJ/cm$^2$.

SYNTHESIS EXAMPLE 9

Synthesis of Resist Composition (II)

The terpolymer (1 g) obtained in Synthesis Examples 6, 7, TPSOTf (0.01 g) as a PAG, and triisooctylamine (2 mg) as a organic base, were completely dissolved in PGMEA (7 g), and then filtered through a membrane filter of 0.2 µm, resulting in a photo resist composition.

The resist composition was applied onto a bare Si-wafer coated with hexamethyldisilazane (HMDS) to form a 0.3 µm-thick photoresist film, followed by pre-baking at a temperature of 120~140° C. for 60~90 seconds, and exposure using an ArF excimer laser exposure apparatus (0.6 NA, σ 0.75).

Subsequently, warming (PEB) of the photoresist film after exposure was conducted at a temperature of 110~140° C. for 60~90 seconds, followed by development using 2.38 wt % aqueous solution of TMAH for 60 seconds to form a photoresist pattern. Consequently, an L/S pattern of 180 nm was verified to be formed clearly at the dose of 11~15 mJ/cm$^2$.

The photosensitive polymers of the resist composition according to examples the present invention exhibit a favorably low Tg of 130 to 160° C. The free volume of the resist layer can be decreased by sufficient annealing during the substrate bake. As a result, the resist layer is more resistant to an ambient environment during post-exposure delay (PED). Thus, enhanced photolithography process characteristics can be obtained, which is useful in the manufacture of next-generation semiconductor devices.

What is claimed is:

1. A photosensitive polymer comprising a copolymer of alkyl vinyl ether and maleic anhydride, said copolymer represented the following structure:

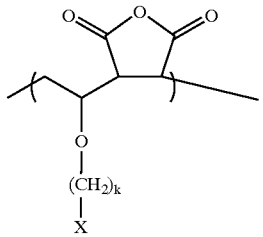

wherein k is an integer of 3 to 8, and wherein X is tertiary cyclic having 7 to 20 carbon atoms, and wherein the weight average molecular weight of the copolymer is equal to or less than 50,000.

2. The photosensitive polymer according to claim 1, wherein the cyclic alcohol is one of a cyclopentyl group, a cyclohexyl group, an a-norbornyl group, a 2-adamantyl group, a 8-tricyclodecyl group, and a decahydronaphthyl group.

3. The photosensitive polymer according to claim 1, wherein the weight average molecular weight of the copolymer is equal to or greater than 3,000.

4. A photosensitive polymer comprising;
   (a) a copolymer of alkyl vinyl ether and maleic anhydride, said copolymer represented by the following structure:

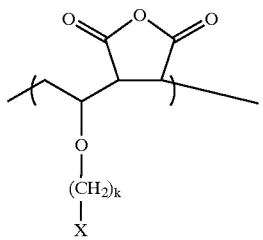

wherein k is an integer of 3 to 8, and wherein X is tertiary cyclic alcohol having 7 to 20 carbon atoms; and
   (b) a comonomer having an acid-labile substituent or a polar functional group,
   wherein the weight average molecular weight of the photosensitive polymer is equal to or less than 50,000.

5. The photosensitive polymer according to claim 4, wherein the weight average molecular weight of the photosensitive polymer is equal to or more than 3,000.

6. A photosensitive polymer comprising a comonomer and a copolymer of alkyl vinyl ether and maleic anhydride, wherein the comonomer is a (meth)acrylate derivative, and the photosensitive olymer is represented by the following structure:

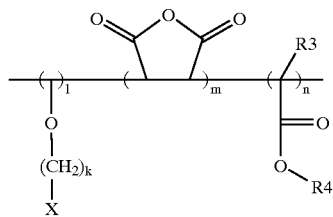

wherein R3 is a hydrogen atom or a methyl group, R4 is an acid-labile group having 4 to 20 carbon atoms, and l/(l+m+n)=0.1 to 0.4, m/(l+m+n)=0.3 to 0.5, n/(l+m+n)=0.2 to 0.5.

7. The photosensitive polymer according to claim 6, wherein R4 is one of a tert-butyl group, a tetrahydropyranyl group, and a 1-ethoxy ethyl group.

8. The photosensitive polymer according to claim 6, wherein R4 is an alicyclic acid-labile group.

9. The photosensitive polymer according to claim 6, wherein R4 is one of 2-methyl-2-adamantyl, 2-ethyl-2-adamantyl, 2-propyl-2-adamantyl, 8-methyl-8-tricyclodecyl, 8-ethyl-8-tricyclodecyl.

10. The photosensitive polymer according to claim 6, wherein the weight average molecular weight of the photosensitive polymer is in the range of 3,000 to 50,000.

11. The photosensitive polymer comprising an alkyl vinyl ether, maleic anhydride, and a norbornene derivative, and represented by the following structure:

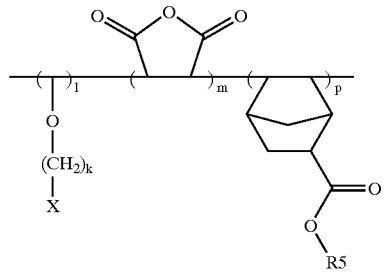

wherein R5 is an acid-labile group having 4 to 20 carbon atoms, an l/(l+m+p)=0.1 to 0.4, m/(l+m+p)=0.3 to 0.5, p/(l+m+p)=0.2 to 0.5.

12. The photosensitive polymer according to claim 11, wherein R5 is one of a tert-butyl group, a tetrahydropyranyl group, and a 1-ethoxy ethyl group.

13. The photosensitive polymer according to claim 11, wherein R5 is an alicyclic acid-labile group.

14. The photosensitive terpolymer according to claim 11, wherein R5 is one of 2-methyl-2-adamantyl, 2-ethyl-2-adamantyl, 2-propyl-2-adamantyl, 8-methyl-8-tricyclodecyl, 8-ethyl-8-tricyclodecyl.

15. The photosensitive polymer according to claim 11, wherein the weight average molecular weight of the photosensitive polymer is in the range of 3,000 to 50,000.

16. A photosensitive polymer comprising;
  (a) a copolymer of alkyl vinyl ether and maleic anhydride, said copolymer represented by the following structure:

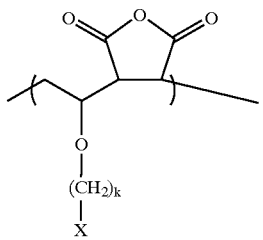

wherein k is an integer of 3 to 8, and wherein X is tertiary cyclic alcohol having 7 to 20 carbon atoms; and
  (b) at least two comonomers each comprising (meth)acrylic acid and (meth)acrylate or norbornene derivatives having an acid-labile substituent or a polar functional group,
  wherein the weight average molecular weight of the photosensitive polymer is equal to or less than 50,000.

17. The photosensitive polymer according to claim 16, wherein the cyclic alcohol is one of a cyclopentyl group, a cyclohexyl group, an a-norbornyl group, a 2-adamantyl group, an 8-tricyclodecyl group, and a decahydronaphthyl group.

18. The photosensitive polymer according to claim 16, wherein the weight average molecular weight of the photosensitive polymer is equal to or more than 3,000.

19. A photosensitive polymer comprising an alkyl vinyl ether, maleic anhydride, and at least two comonomers, and represented by the following structure:

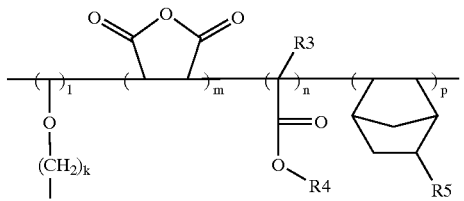

wherein R3 is a hydrogen atom or a methyl group, R4 and R5 is one of a hydrogen, hydroxy, alkyl, alkoxy, ester, nitrile group and an acid labile group having 4 to 20 carbon atoms, at least one of R4 and R5 is an acid labile group having 4 to 20 carbon atoms, and l/(l+m+n+p)=0.1 to 0.4, m/(l+m+n+p)=0.3 to 0.5, n/(l+m+n+p)=0.2 to 0.5, and p/(l+m+n+p)=0.2 to 0.5.

20. The photosensitive polymer according to claim 19, wherein R4 is one of a tert-butyl group, a tetrahydropyranyl group, and a 1-ethoxy ethyl group.

21. The photosensitive polymer according to claim 19, wherein R4 is an alicyclic acid-labile group.

22. The photosensitive tetrapolymer according to claim 19, wherein R4 is one of 2-methyl-2-adamantyl, 2-ethyl-2-adamantyl, 2-propyl-2-adamantyl, 8-methyl-8-tricyclodecyl, 8-ethyl-8-tricyclodecyl.

23. The photosensitive polymer according to claim 19, wherein R5 is one of a tert-butyl ester group, a tetrahydropyranyl ester group, and 1-ethoxy ethyl ester group.

24. The photosensitive tetrapolymer according to claim 19, wherein R5 is an alicyclic acid-labile ester group.

25. The photosensitive terpolymer according to claim 19, wherein R5 is one of 2-methyl-2-adamantyl, 2-ethyl-2-adamantyl, 2-propyl-2-adamantyl, 8-methyl-8-tricyclodecyl, 8-ethyl-8-tricyclodecyl.

26. A resist composition comprising;
(a) a photoacid generator(PAG); and
(b) a photosensitive polymer comprising (1) a comonomer having an acid-labile substituent group or a polar functional group, and (2) a copolymer of alkyl vinyl ether and maleic anhydride, said copolymer represented by the following structure:

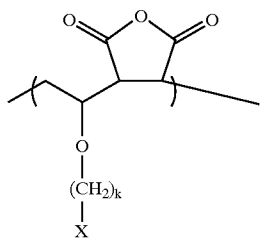

wherein k is an integer of 3 to 8, and wherein X is tertiary cyclic alcohol having 7 to 20 carbon atoms, and wherein the weight average molecular weight of the photosensitive polymer is equal to or less than 50,000.

27. The resist composition according to claim 26, wherein the cyclic alcohol is one of a cyclopentyl group, a cyclohexyl group, an a-norbornyl group, a 2-adamantyl group, an 8-tricyclodecyl group, and a decahydronaphthyl group.

28. The resist composition according to claim 26, wherein the comonomer includes a (meth)acrylate or norbornene derivative.

29. The resist composition according to claim 26, wherein the comonomer has an alicyclic hydrocarbon group as a substituent.

30. The resist composition according to claim 26, wherein the PAG is contained in amount of 1 to 10% by weight based on the weight of the photosensitive polymer.

31. The resist composition according to claim 26, wherein the PAG is selected from the group consisting of triarylsulfonium salts, diaryliodonium salts, sulfonates or mixtures thereof.

32. The resist composition according to claim 26, further comprising an organic base.

33. The resist composition according to claim 32, wherein the organic base is contained in amount of 0.1 to 1.0% by weight based on the concentration of the PAG.

34. The resist composition according to claim 32, wherein the organic base is a compound comprising tertiary amine alone or a mixture of at least two kinds thereof.

35. The resist composition of claim 32, wherein the organic base comprises triethylamine, triisobutylamine, trioctylamine, triisodecylamine, triethanolamine or mixtures thereof.

36. The photosensitive polymer according to claim 26, wherein the weight average molecular weight of the photosensitive polymer is equal to or more than 3,000.

37. A method of forming a photoresist pattern, said method comprising:

applying a resist composition on a substrate, the resist composition having (a) a photoacid generator(PAG) and (b) a photosensitive polymer comprising (1) a comonomer having an acid-labile substituent group or a polar functional group, and (2) a copolymer of alkyl vinyl ether and maleic anhydride, the copolymer represented by the following structure:

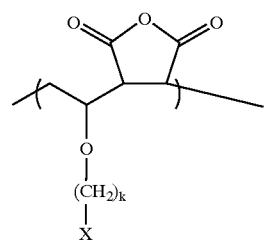

wherein k is an integer of 3 to 8, and wherein X is tertiary cyclic alcohol having 7 to 20 carbon atoms, and wherein the weight average molecular weight of the photosensitive polymer is equal to or less than 50,000;

exposing said resist composition to patterned radiation to introduce a patterned image into said resist composition, wherein the radiation is selected from the group consisting of ultraviolet radiation, x-ray radiation, and electron beam radiation;

baking the substrate on which said resist composition is applied and introduced with the patterned image; and developing the baked substrate.

38. The method of claim 37, wherein the substrate is baked at a temperature range of 130° C. to 160° C.

39. The photosensitive polymer according to claim 37, wherein the weight average molecular weight of the photosensitive polymer is equal to or more than 3,000.

* * * * *